United States Patent
He et al.

(10) Patent No.: US 10,666,014 B2
(45) Date of Patent: May 26, 2020

(54) TUNABLE LASER AND MANUFACTURING METHOD FOR TUNABLE LASER

(71) Applicant: Huawei Technologies Co., Ltd., Shenzhen, Guangdong (CN)

(72) Inventors: Jifang He, Wuhan (CN); Hongmin Chen, Santa Clara, CA (US); Hongbing Lei, Santa Clara, CA (US); Xiao Andy Shen, Santa Clara, CA (US)

(73) Assignee: HUAWEI TECHNOLOGIES CO., LTD., Shenzhen, Guangdong (CN)

(*) Notice: Subject to any disclaimer, the term of this patent is extended or adjusted under 35 U.S.C. 154(b) by 0 days.

(21) Appl. No.: 16/138,648

(22) Filed: Sep. 21, 2018

(65) Prior Publication Data

US 2019/0027896 A1    Jan. 24, 2019

Related U.S. Application Data

(63) Continuation of application No. PCT/CN2016/104052, filed on Oct. 31, 2016.

(30) Foreign Application Priority Data

Mar. 23, 2016  (CN) .......................... 2016 1 0169359

(51) Int. Cl.
*H01S 5/06* (2006.01)
*H01S 5/343* (2006.01)
(Continued)

(52) U.S. Cl.
CPC .......... *H01S 5/0612* (2013.01); *H01S 5/0261* (2013.01); *H01S 5/02461* (2013.01);
(Continued)

(58) Field of Classification Search
CPC .. H01S 5/02461; H01S 5/2045; H01S 5/0612; H01S 5/3438; H01S 5/0261;
(Continued)

(56) References Cited

U.S. PATENT DOCUMENTS 8,194,710 B2 * 6/2012 Ishikawa ................. H01S 5/024
372/46.014
2004/0105480 A1 6/2004 Sidorin et al.
2005/0169566 A1 * 8/2005 Takahashi ............... G02F 1/011
385/1
2005/0249256 A1 11/2005 He
(Continued)

FOREIGN PATENT DOCUMENTS

CN         1659469 A      8/2005
CN       102414600 A      4/2012
(Continued)

*Primary Examiner* — Tuan N Nguyen
(74) *Attorney, Agent, or Firm* — Womble Bond Dickinson (US) LLP

(57) ABSTRACT

A wavelength tunable laser includes: a heating layer, a dielectric layer, reflectors, a transport layer, a support layer, and a substrate layer. The heating layer is located above the transport layer; the transport layer is located above the support layer, and the transport layer includes an upper cladding layer, a waveguide layer, and a lower cladding layer from top to bottom; the reflector is located in the transport layer; the support layer has a protection structure, where the protection structure forms a hollow structure together with the transport layer and the substrate layer, and the hollow structure has a support structure; and the substrate layer is located below the support layer. The heating layer, the reflector, and a part of the transport layer form a suspended structure to prevent heat dissipation. Thus thermal tuning efficiency can be improved, and power consumption can be lowered.

17 Claims, 9 Drawing Sheets

(51) Int. Cl.
*H01S 5/024* (2006.01)
*H01S 5/026* (2006.01)
*H01S 5/20* (2006.01)
*H01S 5/125* (2006.01)
*H01S 5/10* (2006.01)
*H01S 5/0625* (2006.01)

(52) U.S. Cl.
CPC .......... *H01S 5/2045* (2013.01); *H01S 5/2086* (2013.01); *H01S 5/3438* (2013.01); *H01S 5/02453* (2013.01); *H01S 5/0625* (2013.01); *H01S 5/06256* (2013.01); *H01S 5/1003* (2013.01); *H01S 5/125* (2013.01); *H01S 5/209* (2013.01); *H01S 5/34326* (2013.01)

(58) Field of Classification Search
CPC .... H01S 5/2086; H01S 5/02453; H01S 5/209; H01S 5/34326; H01S 5/1003
See application file for complete search history.

(56) References Cited

U.S. PATENT DOCUMENTS

| | | |
|---|---|---|
| 2009/0074020 A1 | 3/2009 | Matsui et al. |
| 2010/0290736 A1 | 11/2010 | Cunningham et al. |
| 2011/0150018 A1 | 6/2011 | Park et al. |
| 2014/0010248 A1 | 1/2014 | Larson |
| 2014/0064315 A1 | 3/2014 | Dummer et al. |
| 2014/0321488 A1* | 10/2014 | Chen ................ H01S 5/0261 372/34 |
| 2016/0118772 A1 | 4/2016 | Chen et al. |

FOREIGN PATENT DOCUMENTS

| | | | | |
|---|---|---|---|---|
| CN | 103532009 A | | 1/2014 | |
| CN | 105409071 A | | 3/2016 | |
| JP | 2004037524 A | | 2/2004 | |
| JP | 2012174938 | * | 9/2012 | ............ H01S 5/026 |
| JP | 2012174938 A | | 9/2012 | |
| JP | 2014017481 A | | 1/2014 | |
| JP | 2015170750 A | | 9/2015 | |

\* cited by examiner

TUNABLE LASER AND MANUFACTURING METHOD FOR TUNABLE LASER

CROSS-REFERENCE TO RELATED APPLICATIONS

This application is a continuation of International Application No. PCT/CN2016/104052 filed on Oct. 31, 2016, which claims priority to Chinese Patent Application No. 201610169359.0 filed on Mar. 23, 2016. The disclosures of the aforementioned applications are hereby incorporated by reference in their entireties.

TECHNICAL FIELD

The present application relates to the field of fiber optic communications, and in particular, to a wavelength tunable laser and a manufacturing method.

BACKGROUND

In the field of optical communications, a Tunable Laser (TL) is a laser whose output wavelength can be adjusted within a particular range. The tunable laser is mainly applied to optical transmission by means of coherent modulation, and coherent modulation has become a mainstream solution in the industry in long-distance optical transmission at a rate of 100 G and above. Driven by growing requirements on bandwidths, the market size continues to grow rapidly, and higher requirements are imposed on a tunable optical laser in terms of a size, costs, performance, reliability, and the like. A monolithically integrated tunable laser has such advantages as a small size and a high integration level, and therefore, has become a current mainstream technology in the field of optical communications.

A tunable laser may be substantially manufactured by connecting a gain area to a passive area on an Indium Phosphide (InP) substrate. The gain area is usually a Multiple Quantum Well (MQW), and the passive area mainly includes a reflector (for example, a Distributed Bragg Reflector (DBR)) section and a phase section. Wavelength tuning is implemented by tuning a refractive index of the DBR section. There are mainly two types of tuning mechanisms: tuning by means of current injection and thermal tuning using a local heating. Thermal tuning has a lower tuning loss than tuning by means of current injection, and therefore, implements a narrower line width of a laser, and can meet a requirement of a high-speed optical transmission network for a narrow line width of a laser. However, within a similar wavelength range, power consumption in a thermal tuning technology is much higher than power consumption in tuning by means of current injection.

In short, by means of the thermal tuning technology, a narrower line width of a laser can be obtained, and the requirement of the high-speed optical transmission network can be met. However, there is a problem that a tuning component has excessively high power consumption.

SUMMARY

An objective of the present invention is to provide a wavelength tunable laser using thermal tuning and a manufacturing method for a wavelength tunable laser using thermal tuning, where the tunable laser has higher thermal tuning efficiency and lower power consumption.

According to a first aspect, a wavelength tunable laser using thermal tuning is provided, including: a heating layer, reflectors, a transport layer, a support layer, and a substrate layer, where the heating layer is located above the transport layer; the transport layer is located above the support layer, and includes an upper cladding layer, a waveguide layer, and a lower cladding layer from top to bottom; the reflector is located in the transport layer; the support layer is located between the transport layer and the substrate layer, and has a protection structure, where the protection structure forms a hollow structure together with the transport layer and the substrate layer, and the hollow structure has a support structure; and the substrate layer is located below the support layer.

After heat provided by the heating layer passes through the reflector, a part of the heat passes through the transport layer, the support layer, and the substrate layer and is gradually dissipated. The support layer has the hollow structure, only the support structure exists in the hollow structure, and most are gaps. Therefore, a lot of heat is insulated by the gaps, so that heat acting on the reflector is increased, thereby improving thermal tuning efficiency.

With reference to the first aspect, in a first possible implementation of the first aspect, in a first direction, there is a gap between the support structure and the protection structure, and the first direction is a transmission direction of light in the waveguide layer. The gap can achieve a heat insulation effect.

With reference to the first aspect or the first possible implementation of the first aspect, in a second possible implementation of the first aspect, in a second direction, there is a gap between the support structure and the protection structure, and the second direction is perpendicular to the transmission direction of light in the waveguide layer. The gap can achieve a heat insulation effect.

With reference to the second possible implementation of the first aspect, in a third possible implementation of the first aspect, there is one or more support structures.

With reference to the first aspect, in a fourth possible implementation of the first aspect, the reflector is located at a lower part of the upper cladding layer of the transport layer, or is located at an upper part of the lower cladding layer, or exists in both the upper cladding layer and the waveguide layer, or exists in both the lower cladding layer and the waveguide layer; and is configured to adjust a wavelength of light emitted by the laser.

With reference to the first aspect, in a fifth possible implementation the first aspect, the transport layer further includes: a first barrier layer, located below the lower cladding layer, so that the transport layer can be prevented from being etched by an etchant.

With reference to the first aspect, in a sixth possible implementation of the first aspect, the substrate layer further includes: a second barrier layer, located above a substrate material layer, and configured to prevent the substrate layer from being etched by an etchant; and the substrate material layer, located below the second barrier layer, and configured to provide mechanical support to a chip of the laser.

With reference to the first aspect, in a seventh possible implementation of the first aspect, the transport layer further includes: a dielectric layer, located above the upper cladding layer, and configured to prevent a current in the heating layer from leaking into the transport layer.

With reference to the first aspect, in an eighth possible implementation of the first aspect, in a first direction, there are gaps between a part, including the reflector, of the transport layer and materials on two sides of the transport layer, to form a suspended structure, and the support structure is disposed below the suspended structure; within a length range of the reflector in the first direction, the gap completely isolates the suspended structure from the materials on the two sides of the transport layer, so that the suspended structure is not connected to the materials on the two sides of the transport layer; and the first direction is a transmission direction of light in the waveguide layer.

Within a length range of the reflector in the first direction, the gap completely isolates the suspended structure from the materials on the two sides of the transport layer, so that dissipation of the heat provided by the heating layer is reduced in a horizontal direction of the reflector, thereby further improving thermal tuning efficiency.

With reference to the first aspect, in a ninth possible implementation of the first aspect, in a first direction, there are gaps between a part, including the reflector, of the transport layer and materials on two sides of the transport layer, to form a suspended structure, and the support structure is disposed below the suspended structure; within a length range of the reflector in the first direction, the gap partially isolates the suspended structure from the materials on the two sides of the transport layer, so that the suspended structure and the materials on the two sides of the transport layer have one or more connection structures, thereby improving thermal tuning efficiency, and ensuring that a chip has relatively high mechanical strength. The first direction is a transmission direction of light in the waveguide layer, and the second direction is perpendicular to the transmission direction of light in the waveguide layer.

With reference to the first aspect or the eighth or the ninth possible implementation of the first aspect, in a tenth possible implementation of the first aspect, the suspended structure has a varying width in the first direction.

With reference to the tenth possible implementation of the first aspect, in an eleventh possible implementation of the first aspect, the support structure is disposed below a wider part of the suspended structure, and the support structure is not disposed below a narrower part of the suspended structure. The support structure provides support to the suspended structure from bottom to top.

With reference to the tenth possible implementation of the first aspect, in a twelfth possible implementation of the first aspect, a support structure of a large size is disposed below a wider part of the suspended structure, and a support structure of a small size is disposed below a narrower part of the suspended structure. Compared with the tenth possible implementation, in this implementation, there are more support structures, and mechanical strength is higher.

With reference to the tenth possible implementation of the first aspect, in a thirteenth possible implementation of the first aspect, a width of the suspended structure in the first direction is greater than or equal to a width of the reflector in the first direction. The suspended structure needs to include the reflector, so that more heat acts on the reflector, thereby improving thermal tuning efficiency.

According to a second aspect, a manufacturing method for a wavelength tunable laser using thermal tuning is provided, including: growing a substrate with a plurality of layers of materials, where the multi-layer substrate includes a transport layer, a support layer, and a substrate layer, where the transport layer is located above the support layer, and includes an upper cladding layer, a waveguide layer, and a lower cladding layer from top to bottom; reflectors further exist in the transport layer; the support layer is located between the transport layer and the substrate layer; and the substrate layer is located below the support layer; depositing a heating layer above the transport layer; and etching the support layer by using a first etchant, to form a protection structure of the support layer, where the protection structure forms a hollow structure together with the transport layer and the substrate layer, and the hollow structure has a support structure.

After heat provided by the heating layer passes through the reflector, a part of the heat passes through the transport layer, the support layer, and the substrate layer and is gradually dissipated. The support layer is etched to form the hollow structure by using the first etchant, only the support structure exists in the hollow structure, and most are gaps. Therefore, a lot of heat is insulated by the gaps, so that heat acting on the reflector is increased, thereby improving thermal tuning efficiency.

With reference to the second aspect, in a first possible implementation of the second aspect, that reflectors exist in the transport layer specifically includes: the reflector exists at a lower part of the upper cladding layer, or the reflector exists at an upper part of the lower cladding layer, or the reflector exists in both the upper cladding layer and the waveguide layer, or the reflector exists in both the lower cladding layer and the waveguide layer; and is configured to adjust an output wavelength of the laser.

With reference to the second aspect, in a second possible implementation of the second aspect, the transport layer further includes a first barrier layer, specifically including: the first barrier layer exists below the lower cladding layer of the transport layer, where an etching reaction does not take place between the first barrier layer and the first etchant, or an etching reaction takes place between the first barrier layer and the first etchant, but a reaction rate is lower than a rate of an etching reaction between the support layer and the first etchant, thereby protecting the transport layer from being etched by the first etchant.

With reference to the second aspect, in a third possible implementation of the second aspect, the substrate layer further includes a second barrier layer and a substrate material layer, specifically including: the second barrier layer is located above the substrate material layer, where an etching reaction does not take place between the second barrier layer and the first etchant, or an etching reaction takes place between the second barrier layer and the first etchant, but a reaction rate is lower than a rate of an etching reaction between the support layer and the first etchant, thereby protecting the substrate layer from being etched by the first etchant.

With reference to the second aspect, in a fourth possible implementation of the second aspect, before the depositing a heating layer above the transport layer, the manufacturing method further includes: growing a dielectric layer above the upper cladding layer, where the dielectric layer uses an insulation material, so that a current in the heating layer can be prevented from leaking into the transport layer.

With reference to the second possible implementation of the second aspect, in a fifth possible implementation of the second aspect, before the etching the support layer by using a first etchant, the manufacturing method further includes: completely etching materials that are on two sides of the transport layer and that are in a first direction of the reflector by using a second etchant, to expose the first barrier layer, where an etching reaction does not take place between the second etchant and the first barrier layer, or an etching reaction takes place between the second etchant and the first barrier layer, but a reaction rate is lower than a rate of an etching reaction between the second etchant and the transport layer; and the first direction is a transmission direction of light in the waveguide layer; and forming a graphical area on the first barrier layer by means of photolithography, and etching the graphical area on the first barrier layer by using a third etchant, to expose the support layer, so that a part, including the reflector, of the transport layer forms a suspended structure supported by a bottom support structure, where an etching reaction does not take place between the third etchant and the transport layer or the support layer, or an etching reaction takes place between the third etchant and the transport layer or the support layer, but a reaction rate is lower than a rate of an etching reaction between the third etchant and the first barrier layer.

With reference to the second possible implementation of the second aspect, in a sixth possible implementation of the second aspect, before the etching the support layer by using a first etchant, the manufacturing method further includes: partially etching materials that are on two sides of the transport layer and that are in a first direction of the reflector by using a second etchant, to expose the first barrier layer, where an etching reaction does not take place between the second etchant and the first barrier layer, or an etching reaction takes place between the second etchant and the first barrier layer, but a reaction rate is lower than a rate of an etching reaction between the second etchant and the transport layer; and the first direction is a transmission direction of light in the waveguide layer; and forming a graphical area on the first barrier layer by means of photolithography, and etching the graphical area on the first barrier layer by using a third etchant, to expose the support layer, so that a part, including the reflector, of the transport layer forms a suspended structure supported by both a bottom support structure and a horizontal support structure, where an etching reaction does not take place between the third etchant and the transport layer or the support layer, or an etching reaction takes place between the third etchant and the transport layer or the support layer, but a reaction rate is lower than a rate of an etching reaction between the third etchant and the first barrier layer.

With reference to the fifth or the sixth possible implementation of the second aspect, in a seventh possible implementation of the second aspect, the graphical area has a varying width in the first direction.

The wavelength tunable laser using thermal tuning provided in the present invention includes: the heating layer, the reflectors, the transport layer, the support layer, and the substrate layer. The heating layer is located above the transport layer; the transport layer is located above the support layer, and includes the upper cladding layer, the waveguide layer, and the lower cladding layer from top to bottom; the reflector is located in the transport layer; the support layer is located between the transport layer and the substrate layer, and has the protection structure, where the protection structure forms the hollow structure together with the transport layer and the substrate layer, and the hollow structure has the support structure; and the substrate layer is located below the support layer. After the heat provided by the heating layer passes through the reflector, a part of the heat passes through the transport layer, the support layer, and the substrate layer and is gradually dissipated. The support layer has the hollow structure, only the support structure exists in the hollow structure, and most are gaps. Therefore, a lot of heat is insulated by the gaps, so that heat acting on the reflector is increased, thereby improving thermal tuning efficiency.

BRIEF DESCRIPTION OF THE DRAWINGS

To describe the technical solutions in the embodiments of the present invention more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION

First, it should be understood that, although illustrative implementation solutions in one or more embodiments are disposed below, a disclosed system and/or method can be implemented by means of any quantity of technologies, regardless of whether the technology is currently known or already exists. The present invention should never be limited to the illustrative implementation solutions, the accompanying drawings, and the technologies that are described below, includes examples of designs and implementation solutions illustrated and described in this specification, and can be modified within the scope of the appended claims and the full scope of equivalents thereof.

Three conditions for generating a laser beam are as follows: population inversion is implemented; a threshold condition is satisfied, and a resonance condition is satisfied. The primary condition for generating a laser beam is population inversion. In a semi-conductor, an electron in a valence band needs to be pumped to a conduction band. To implement population inversion, usually, a p-n junction is formed by using heavily doped P-type and N-type materials. In this way, under the action of an external voltage, population inversion occurs near a junction area, and an electron is stored at a high Fermi level, and an electron hole is stored at a low Fermi level. Certainly, there are many other methods for implementing population inversion. Implementation of population inversion is a necessary condition but is not a sufficient condition for generating a laser beam, and a resonant cavity with an extremely low loss is further required to generate a laser beam. A main part of the resonant cavity is two reflectors that are parallel to each other, and stimulated emission light is reflected back and forth between the two reflectors, to continuously cause new stimulated emission, so that the stimulated emission light is continuously amplified. Strengthened interference can occur at an output end, and a stable laser beam can be output only when a gain obtained by stimulated emission amplification is greater than various losses in a laser, that is, a particular threshold condition is satisfied. The resonance condition means that after a length and a refractive index of the resonant cavity are determined, only light of a particular frequency can form optical oscillation, and a stable laser beam is output. This indicates that the resonant cavity achieves a particular frequency selection function for the output laser beam.

Figure 1:
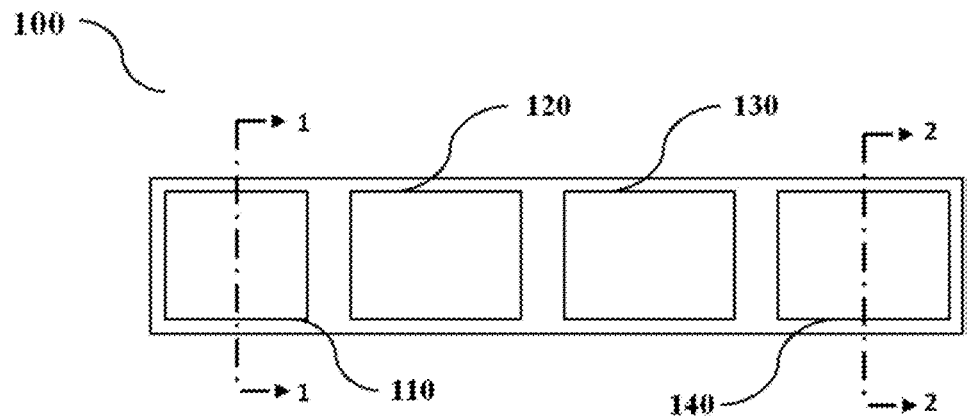
FIG. 1 is a schematic planar diagram of a typical laser using thermal tuning.

A tunable laser is usually manufactured by connecting a gain area and a passive area on an InP substrate, and a schematic planar diagram of the tunable laser is shown in FIG. 1, including a front reflector 110, a gain area 120, a phase adjustment area 130, and a rear reflector 140. A band gap of the gain area 120 is relatively small, and when a current is injected, electric energy is converted to light energy, to provide a gain. The structure of the passive area mainly includes reflectors. A band gap of the passive area is higher than photon energy of a laser beam wavelength, and few laser beams are absorbed, so that a low absorption loss can be provided. To cover an entire C-band (a range of approximately 35 nm), usually, a reflection cavity is formed by using a "Vernier effect" between two reflectors. Because the two reflectors are usually located in front of and behind the gain area, and therefore, are usually referred to as the front reflector 110 and the rear reflector 140 respectively. It may be considered that the two reflectors are equivalent, and their names can be interchanged. In addition, the passive area may further include the phase adjustment area 130, used to perform fine adjustment on an effective optical path in a resonant cavity, to change an output wavelength of the laser.

The two reflectors of the tunable laser both have a comb reflection spectrum having a plurality of reflection peaks. The reflection peak can be adjusted, and the output wavelength of the laser can be adjusted by adjusting the reflection peak. There are mainly two types of existing adjustment mechanisms: tuning by means of current injection and thermal tuning by means of local heating. Thermal tuning can meet a requirement of a high-speed optical transmission network for a narrow line width of a laser, and is applied widely. However, a problem of high power consumption exists, and needs to be resolved urgently.

Figure 2:
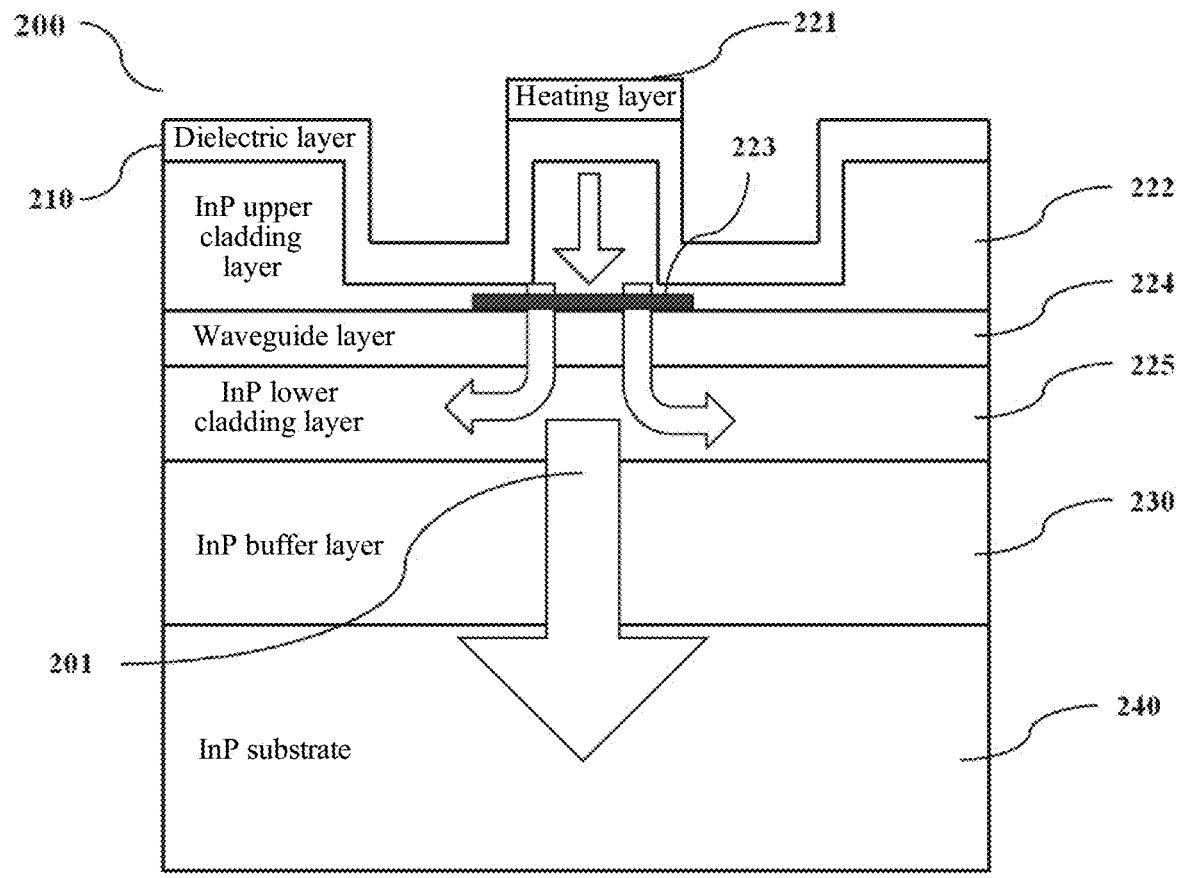
FIG. 2 is a sectional view of the laser using thermal tuning along a position 1-1 or 2-2 in FIG. 1.

FIG. 2 is a sectional view of the laser using thermal tuning along a position 1-1 or 2-2 in FIG. 1. A heating layer 221, a dielectric layer 210, an InP upper cladding layer 222, reflectors 223, a waveguide layer 224, an InP lower cladding layer 225, an InP buffer layer 230, and an InP substrate layer 240 are sequentially included from top to bottom. The heating layer 221 is configured to provide heat to the reflector 223 and may use a heating resistor, and a temperature of the heating resistor can be changed when a current passes through the heating resistor. The dielectric layer 210 is located between the heating layer 221 and the InP upper cladding layer 222, and is configured to prevent a current in the heating layer 221 from leaking into the InP upper cladding layer 222. The InP upper cladding layer 222, the waveguide layer 224, and the InP lower cladding layer 225 are located between the dielectric layer 210 and the InP buffer layer, and are configured to provide a transmission channel with a low loss for an optical signal. The reflector 223 is located in the InP upper cladding layer 222, and is configured to tune a wavelength of the optical signal. The InP buffer layer 230 is located between the InP lower cladding layer 225 and the InP substrate layer 240, and is configured to provide an InP material of better quality, and provide a better material basis for a material of another layer. The InP substrate layer 240 is located below the InP buffer layer 230, and is configured to provide mechanical support.

Within a similar wavelength adjustment range, lower power (that is, power consumption) loaded at two ends of the heating layer 221 indicates higher thermal tuning efficiency and lower entire power consumption of the laser 200. As shown by an arrow in FIG. 2, after the heating layer 221 is heated and its temperature is increased, heat 201 sequentially passes through the dielectric layer 210 and the InP upper cladding layer 222 and is conducted to the reflector 223. However, the heat 201 continues to be transferred downward to the waveguide layer 224, the lower cladding layer 225, and the buffer layer 230 and even to the substrate layer 240. In addition, a part of the heat 201 is transferred to two sides of the reflector 223 horizontally. The heat 201 is all dissipated, and a function of changing a temperature of the reflector 223 is not achieved. Dissipation of the heat 201 is an important reason why power consumption of the thermal tuning mechanism is relatively high.

Figure 3:
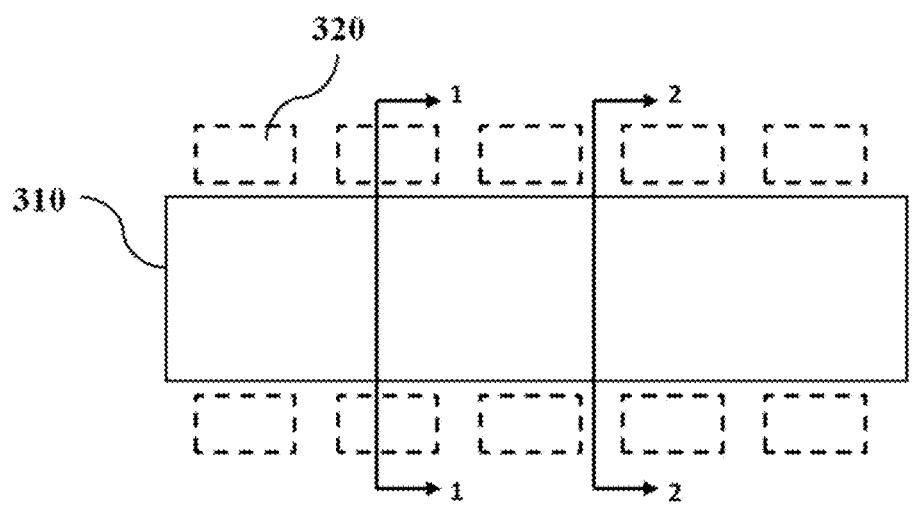
FIG. 3 is a top view of a suspended structure of a laser using thermal tuning that uses a horizontal support structure.

An effective method for preventing a heat loss and concentrating heat in a reflector area is to form heat insulation by using a suspended structure. During actual manufacturing, a suspended area needs to be connected to another area of a chip, to form support, and cannot be completely disconnected from the chip; otherwise, the chip collapses or is damaged. An existing technical solution for manufacturing the suspended structure may be summarized as a horizontal support structure solution. A top view of the reflector area of the laser using the solution is shown in FIG. 3. The key is that discontinuous window areas 320 are distributed on two sides of a reflector 310. In a chip manufacturing process, by means of photolithography and by performing etching by using an etchant, a material layer of the window area 320 can be etched, so as to ensure that a material of another area is not etched.

Figure 4:
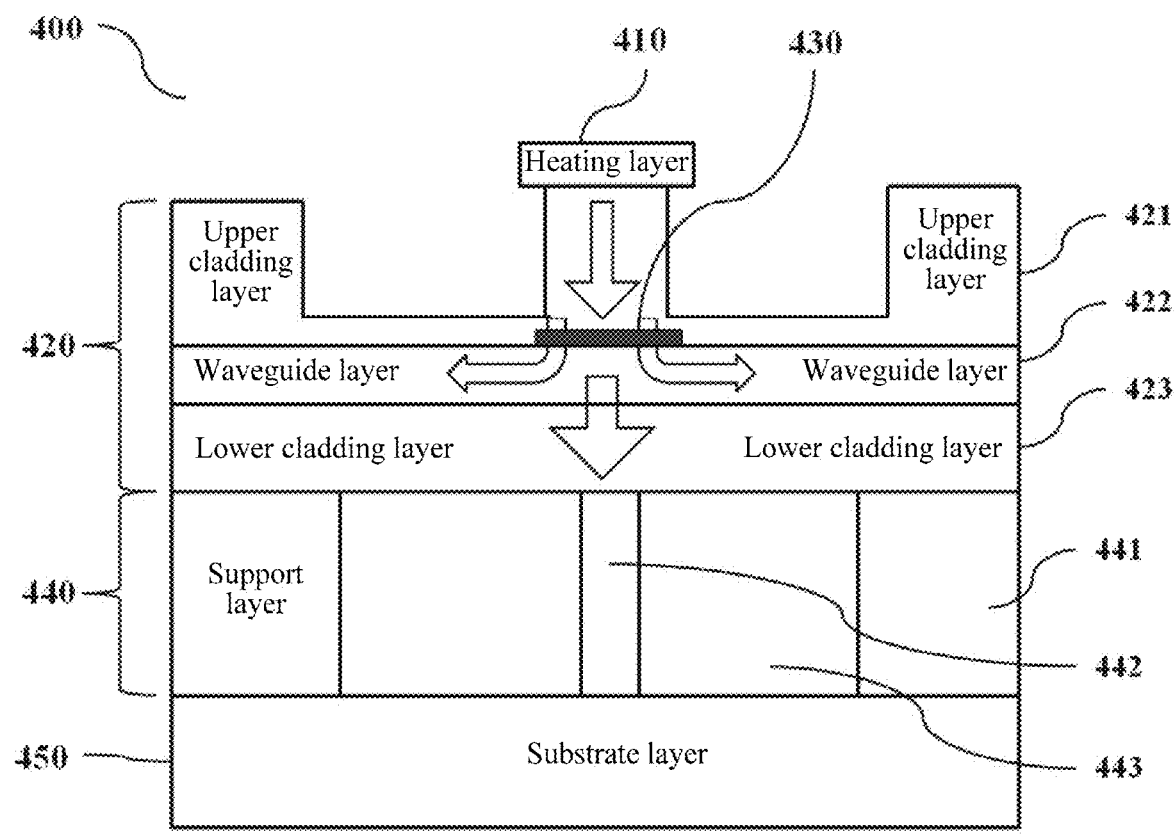
FIG. 4 is a sectional view of a laser using thermal tuning according to an embodiment of the present invention.

FIG. 4 is a sectional view of a laser using thermal tuning according to an embodiment of the present invention. The laser 400 includes: a heating layer 410, a transport layer 420, reflectors 430, a support layer 440, and a substrate layer 450. The heating layer 410 is located above the transport layer 420, may be a device such as a heating resistor, and is configured to provide heat to the reflector 430.

The transport layer includes an upper cladding layer 421, a waveguide layer 422, and a lower cladding layer 423 from top to bottom. The upper cladding layer 421 and the lower cladding layer 423 are configured to limit energy of an optical signal in the waveguide layer 422. The waveguide layer 422 is configured to provide a transmission channel with a low loss for the optical signal.

Specifically, the upper cladding layer 421 and the lower cladding layer 423 may use InP materials. The waveguide layer 422 may use Indium Gallium Arsenide Phosphide (InGaAsP). A refractive index of the InP material is lower than that of InGaAsP. Therefore, during transmission of light in the waveguide layer 422, total reflection is formed, so that energy dissipation of the light can be reduced.

The reflector 430 is located at a lower part of the upper cladding layer 421 or an upper part of the lower cladding layer 423, and is configured to tune a wavelength of the optical signal.

Specifically, the reflector 430 may be a DBR. The DBR can absorb heat to change a refractive index of the DBR, thereby changing the wavelength of the reflected optical signal. The reflector 430 may be a front reflector and/or a rear reflector. This is not limited in this embodiment of the present invention.

The support layer 440 is located between the transport layer 420 and the substrate layer 450, and has a protection structure 441. The protection structure forms a hollow structure together with the transport layer 420 and the substrate layer 450, and the hollow structure has a support structure 442.

The substrate layer 450 is located below the support layer 440, and achieves a function of providing mechanical support to an entire chip.

After the heat provided by the heating layer 410 passes through the reflector 430, a part of the heat passes through the transport layer 420, the support layer 440, and the substrate layer 450 and is gradually dissipated. The support layer has the hollow structure, only the support structure 442 exists in the hollow structure, and most are gaps 443. Therefore, a lot of heat is insulated by the gaps 443, so that heat acting on the reflector 430 is increased, thereby improving thermal tuning efficiency.

It should be understood that, materials and devices for forming various parts of the laser are not limited to those mentioned in the foregoing example, and any material that can achieve a similar function can be used. This is not limited in this embodiment of the present invention.

Optionally, in another embodiment, the transport layer further includes a dielectric layer. The dielectric layer is located above the upper cladding layer 421, and is configured to prevent a current in the heating layer 410 from leaking into the upper cladding layer 421. The dielectric layer may use an insulation material. Specifically, the dielectric layer may use an insulation material such as Silicon Dioxide ($SiO_2$) or Aluminum oxide ($Al_2O_3$).

Figure 5:
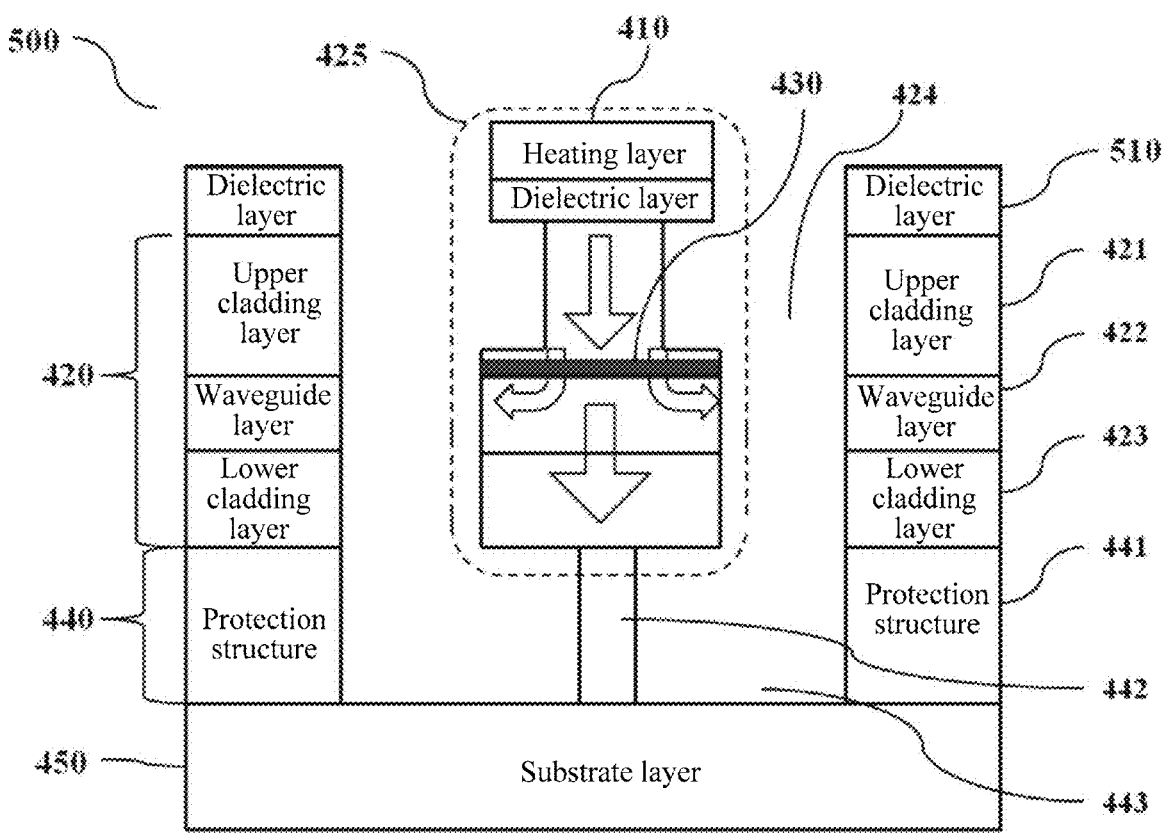
FIG. 5 is a sectional view of a laser using thermal tuning according to another embodiment of the present invention.

FIG. 5 is a sectional view of a laser using thermal tuning according to another embodiment of the present invention. The laser 500 also includes: a heating layer 410, a dielectric layer 510, a transport layer 420, reflectors 430, a support layer 440, and a substrate layer 450. The basic structure of the laser 500 is basically the same as the structure of the laser 400 shown in FIG. 4, and a difference lies in that, in a first direction, there are gaps 424 between a part, including the reflector, of the transport layer and materials on two sides of the transport layer, to form a suspended structure 425. Within a length range of the reflector in the first direction, the gap 424 completely isolates the suspended structure 425 from the materials on the two sides of the transport layer, and is in communication with a gap 443 of the support layer, so that a bottom support structure 442 provides support to the suspended structure 425. The first direction is a transmission direction of light in the waveguide layer.

It should be noted that, there may be one suspended structure 425, and the reflector included in the suspended structure 425 is either of a front reflector and a rear reflector; there may be two suspended structures 425, and one of the two suspended structures 425 includes a front reflector, and the other includes a rear reflector. This is not limited in this embodiment of the present invention.

Specifically, by means of the suspended structure 425, in a horizontal direction, the reflector 430 is isolated from the materials on the two sides of the transport layer in the first direction, and is also well isolated from a material of the substrate layer 450 in a vertical direction, so that heat dissipation can be reduced, and thermal tuning efficiency can be improved. Experimental results show that, thermal tuning efficiency in the solution in this embodiment is 2.5 times higher than thermal tuning efficiency of a laser using thermal tuning without a suspended structure, and is approximately 1 time higher than thermal tuning efficiency in a solution of a horizontally supported suspended structure.

Figure 6:
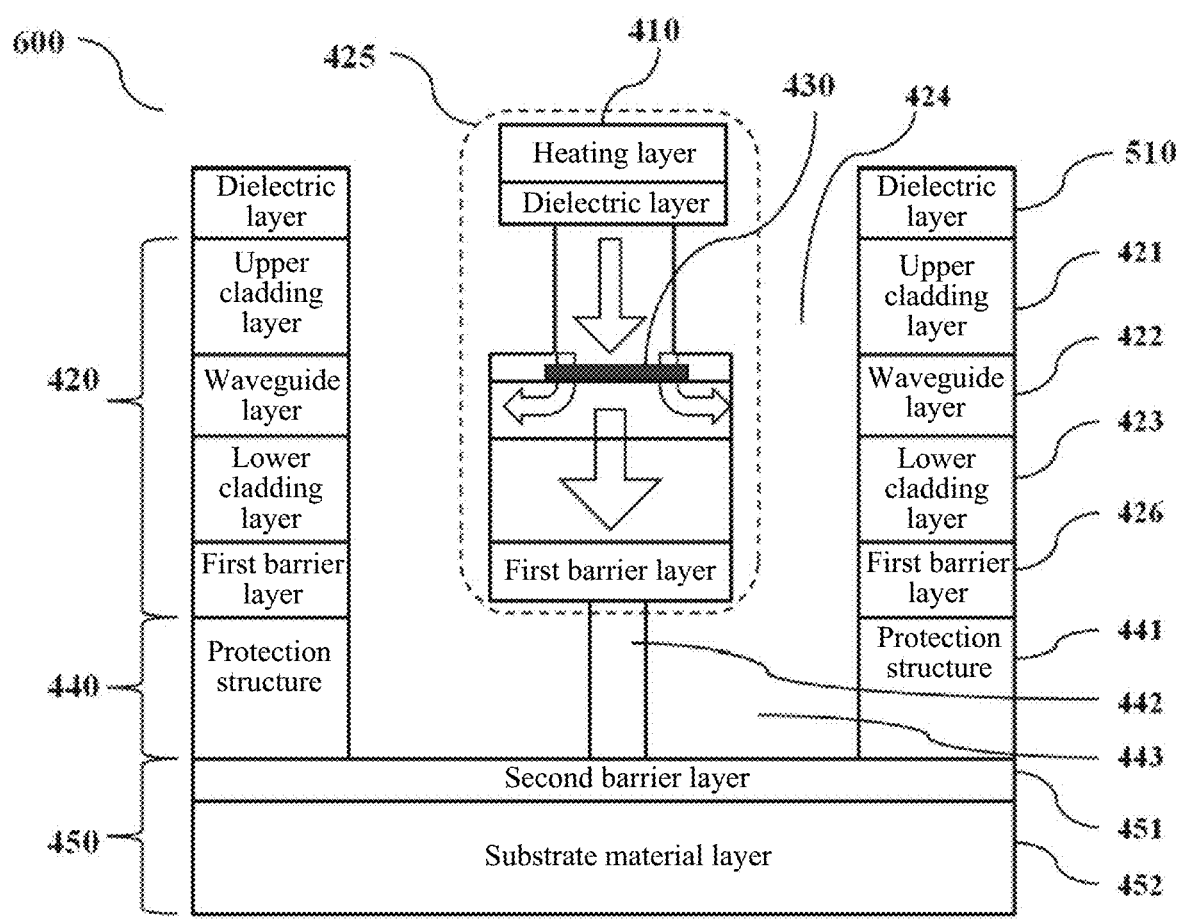
FIG. 6 is a sectional view of a laser using thermal tuning according to another embodiment of the present invention.

FIG. 6 is a sectional view of a laser using thermal tuning according to another embodiment of the present invention. Same parts of the laser 600 and the laser shown in FIG. 5 use same reference numerals, and a difference between the laser 600 and the laser shown in FIG. 5 lies in that:

The transport layer 420 further includes a first barrier layer 426, located below the lower cladding layer 423, and configured to protect the transport layer 420 from being etched by an etchant.

The substrate layer further includes: a second barrier layer 451 and a substrate material layer 452. The second barrier layer 451 is located above the substrate material layer 452, and is configured to protect the substrate layer 450 from being etched by an etchant. The substrate material layer 452 is located below the second barrier layer 451 and provides mechanical support to an entire chip.

Figure 7:
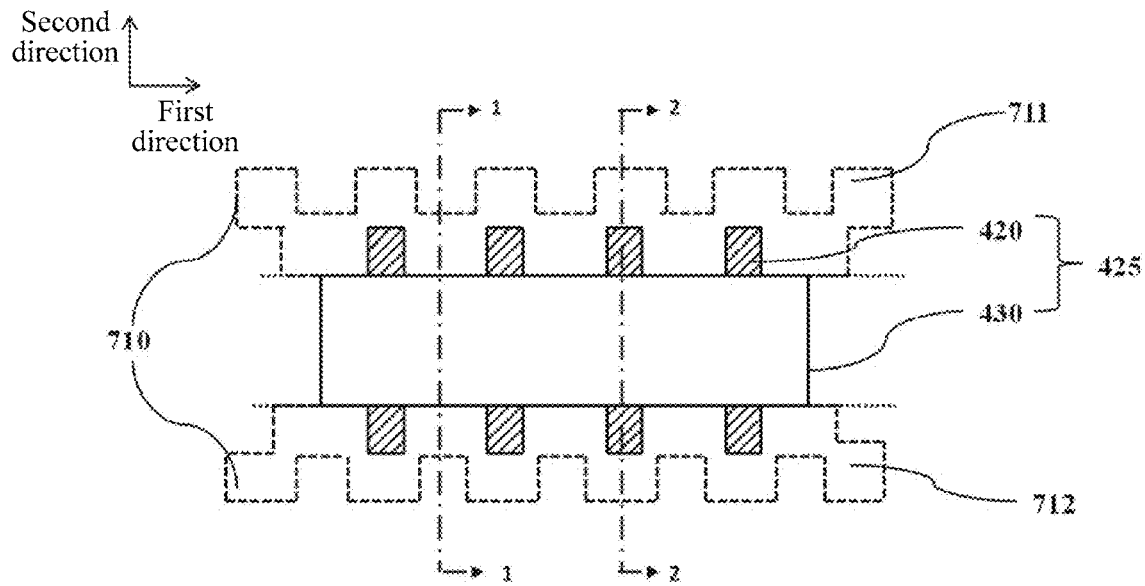
FIG. 7 is a top view of a suspended structure according to another embodiment of the present invention.

FIG. 7 is a top view of a suspended structure according to another embodiment of the present invention. As can be learned from the figure, the suspended structure 425 has a varying width in the first direction, and the width at a position 1-1 is the same as a width of the reflector 430 and is obviously less than the width at a position 2-2. The first direction is a transmission direction of light in the waveguide layer.

Window areas 710 are disposed on two sides of the suspended structure 425 in the first direction. The window area 710 may be divided into a first window area 711 and a second window area 712. The window area 710 has a shape of a gap 424 of the transport layer on the top view, and is used to provide a channel through which an etchant is injected. The first direction is a transmission direction of light in the waveguide layer.

It should be understood that, the shape of the window area 710 is not limited to the form in FIG. 7. For example, an edge of the window area 710 may be in a shape of a right angle, an acute angle, or an obtuse angle, or may be in a shape of an arc, in a shape of a sine or cosine curve, or in another different shape. This is not limited in this embodiment of the present invention.

Figure 8:
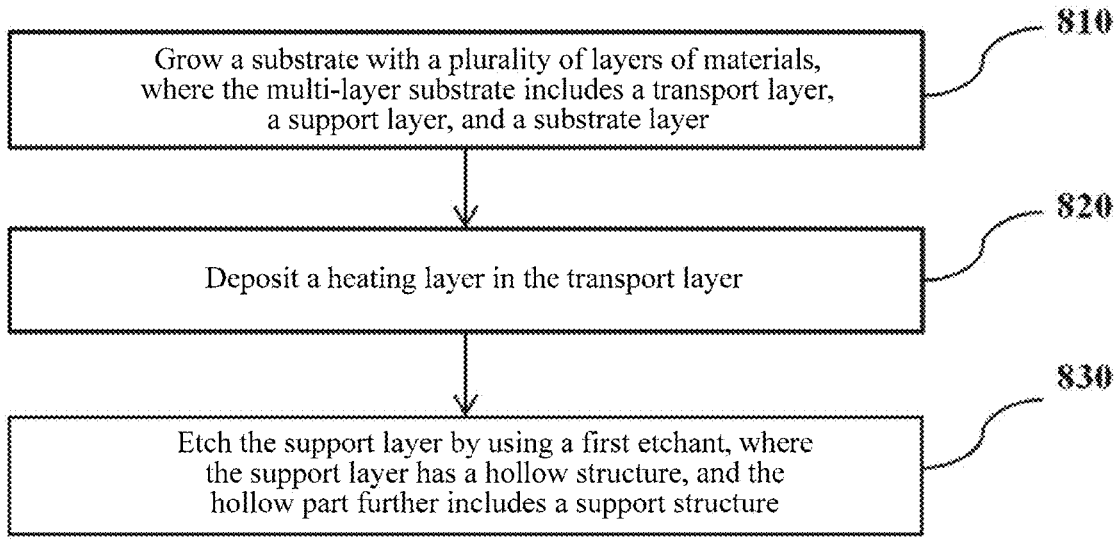
FIG. 8 shows possible manufacturing process steps of a suspended structure according to the present invention.

Another embodiment of the present invention provides a manufacturing method for a suspended structure. As shown in FIG. 8, the method may include the following steps.

810: Grow a substrate with a plurality of layers of materials, where the multi-layer substrate includes a transport layer, a support layer, and a substrate layer.

The transport layer is located above the support layer, and includes an upper cladding layer, a waveguide layer, and a lower cladding layer from top to bottom. Reflectors further exist in the transport layer. The support layer is located between the transport layer and the substrate layer. The substrate layer is located below the support layer.

820: Deposit a heating layer 410 above the transport layer.

830: Etch the support layer 440 by using a first etchant.

The support layer is etched by using the first etchant, to form a protection structure of the support layer. The protection structure forms a hollow structure together with the transport layer and the substrate layer, and the hollow structure has the support structure 442.

Specifically, the first etchant may be injected into the support layer 440 in any possible manner. This is not limited in this embodiment of the present invention.

Optionally, in another embodiment, the transport layer 420 further includes a first barrier layer 426, specifically including: the first barrier layer 426 exists below the lower cladding layer, where an etching reaction does not take place between the first barrier layer 426 and the first etchant, or an etching reaction takes place between the first barrier layer 426 and the first etchant, but a reaction rate is lower than a rate of an etching reaction between the support layer and the first etchant, thereby preventing the transport layer from being etched by the first etchant.

Optionally, in another embodiment, the substrate layer 450 includes a second barrier layer 451 and a substrate material layer 452, specifically including: the second barrier layer 451 is located above the substrate material layer 452, where an etching reaction does not take place between the second barrier layer 451 and the first etchant, or an etching reaction takes place between the second barrier layer 451 and the first etchant, but a reaction rate is lower than a rate of an etching reaction between the support layer 440 and the first etchant, thereby preventing the substrate layer from being etched by the first etchant.

Specifically, materials of the first barrier layer 426 and the second barrier layer 451 may use InP, a material of the support layer 440 may use Indium Aluminum Arsenide (InAlAs), and the first etchant may be a mixed solution of Hydrochloric Acid (HCL) and water. An etching reaction takes place between the mixed solution of hydrochloric acid and water and the material InAlAs of the support layer 440, but an etching reaction does not take place between the mixed solution of hydrochloric acid and water and the InP material.

Further, before the depositing a heating layer 410 above the transport layer, the manufacturing method further includes: growing a dielectric layer above the upper cladding layer, where the dielectric layer uses an insulation material and is configured to isolate current crosstalk between the heating layer 410 and another layer.

Optionally, in another embodiment, before step 830, the manufacturing method further includes: completely etching materials that are on two sides of the transport layer 420 and that are in a first direction of the reflector 430 by using a second etchant, to expose the first barrier layer 426, where an etching reaction does not take place between the second etchant and the first barrier layer 426, or an etching reaction takes place between the second etchant and the first barrier layer 426, but a reaction rate is lower than a rate of an etching reaction between the second etchant and the transport layer 420; and the first direction is a transmission direction of light in the waveguide layer; and forming a graphical area on the first barrier layer 426 by means of photolithography, and etching the graphical area on the first barrier layer 426 by using a third etchant, to expose the support layer, so that a part, including the reflector 430, of the transport layer 420 forms a suspended structure 425 supported by a bottom support structure 442, where an etching reaction does not take place between the third etchant and the transport layer 420 or the support layer 440, or an etching reaction takes place between the third etchant and the transport layer 420 or the support layer 440, but a reaction rate is lower than a rate of an etching reaction between the third etchant and the first barrier layer 426.

Optionally, in another embodiment, before step 830, the manufacturing method further includes: partially etching materials that are on two sides of the transport layer 420 and that are in a first direction of the reflector 410 by using a second etchant, to expose the first barrier layer 426, where an etching reaction does not take place between the second etchant and the first barrier layer 426, or an etching reaction takes place between the second etchant and the first barrier layer 426, but a reaction rate is lower than a rate of an etching reaction between the second etchant and the transport layer 420; and the first direction is a transmission direction of light in the waveguide layer; and forming a graphical area on the first barrier layer 426 by means of photolithography, and etching the graphical area on the first barrier layer 426 by using a third etchant, to expose the support layer, so that a part, including the reflector 430, of the transport layer 420 forms a suspended structure 425 supported by both a bottom support structure 442 and a horizontal support structure, where an etching reaction does not take place between the third etchant and the transport layer or the support layer 420, or an etching reaction takes place between the third etchant and the transport layer or the support layer 420, but a reaction rate is lower than a rate of an etching reaction between the third etchant and the first barrier layer 426.

Specifically, the graphical area may be a channel through which the first etchant is injected into the support layer 440, and a shape of the graphical area may be the same as the shape of the window area 710.

Within a same time, a length and a depth by which a material is etched by an etchant are determinate. Therefore, when a material of the support layer 440 below a relatively narrow part of the suspended structure 425 has been completely etched to form the suspended structure, the material of the support layer 440 below a relatively wide part of the suspended structure 425 is not completely etched, and a part of the material remains below the suspended structure 425, to form the support structure 442, so as to provide support to the suspended structure 425 from the bottom.

Figure 9:
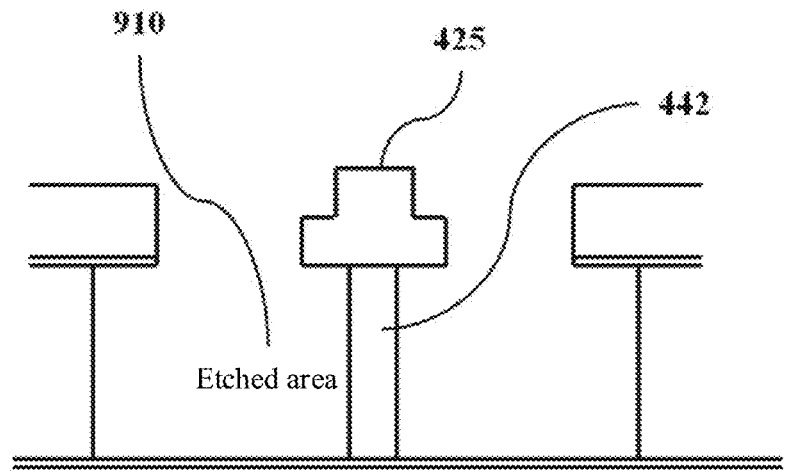
FIG. 9 is a sectional view along a position 2-2 in FIG. 7.

FIG. 9 is a sectional view along the position 2-2 in FIG. 7. As can be learned from the figure, a material of the suspended structure 425 in a horizontal direction is completely etched, but a part of the material remains below the suspended structure 425, to form the support structure 442, to provide support to the suspended structure 425. Because the suspended structure 425 is connected only to the bottom support structure 442, heat dissipation is low, so that thermal tuning efficiency of the laser is higher.

It should be understood that, there may be one support structure 442 or a plurality of support structures 442; and a shape of the support structure 442 may be a rectangle, a column, a trapezium, or another shape. Neither the quantity nor the shape is limited in the present invention.

Figure 10:
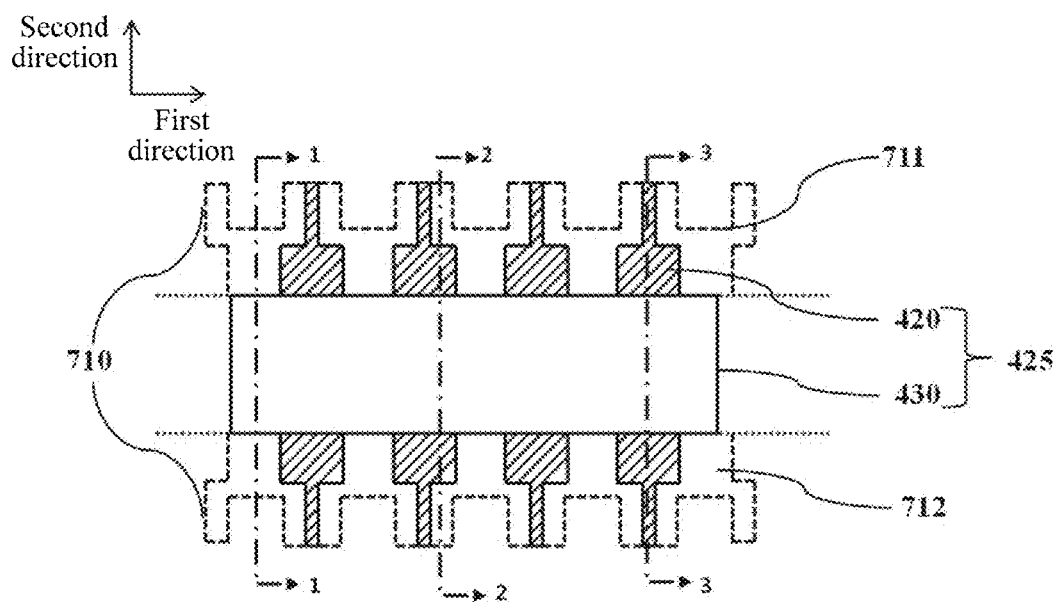
FIG. 10 is a top view of a suspended structure according to another embodiment of the present invention.

Optionally, in another embodiment, in the first direction, the suspended structure 425 is partially connected to the materials on two sides of the transport layer 420, as shown in FIG. 10. FIG. 10 is a top view of the suspended structure 425 in this embodiment. As can be learned from the figure, at a position 1-1, a width of the suspended structure 425 in the first direction is relatively small; at a position 2-2, the width of the suspended structure 425 in the first direction is relatively large; at a position 3-3, there is a gap of the window structure 710, and the gap is not etched by an etchant. An etching process has been described in the foregoing embodiment, and details are not described herein again.

Figure 11:
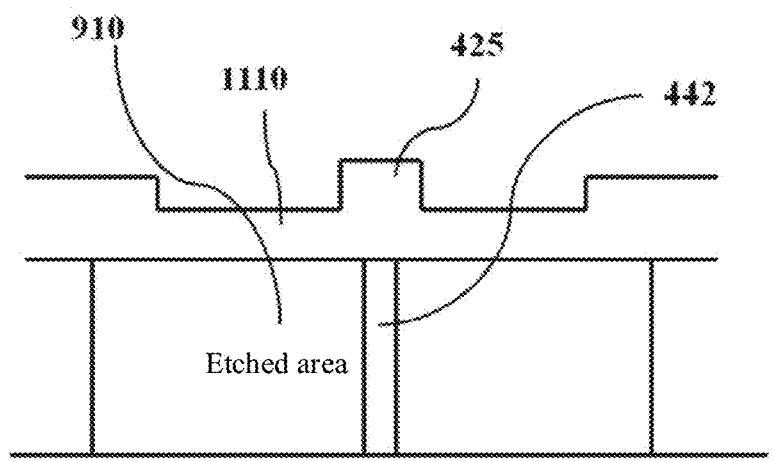
FIG. 11 is a sectional view along a position 3-3 in FIG. 10.

Because a window gap such as the window gap at the position 3-3 exists, the material in the horizontal direction is not completely etched. FIG. 11 is a sectional view along the position 3-3 in FIG. 10. The suspended structure 425 is characterized in that: the support part includes not only the bottom support structure 442 but also a lateral support structure 1110, and more support structures can provide higher mechanical strength.

It should be understood that, in this embodiment, the shape of the window area 710 is not limited to the form in FIG. 10, and may further have another form. For example, the window area 710 is shorter than a length of the reflector 430 in the first direction, a material corresponding to the short part in the horizontal direction is not etched, to form support in the horizontal direction.

Figure 12:
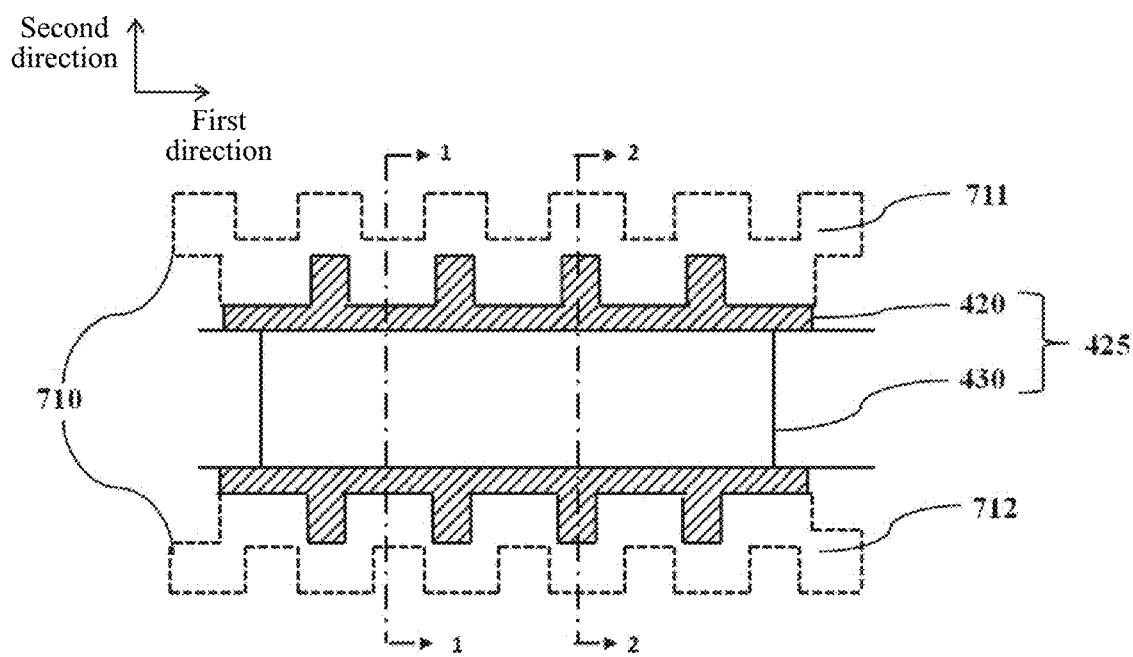
FIG. 12 is a top view of a suspended structure according to another embodiment of the present invention.

Optionally, in another embodiment, a width of a narrowest part of the suspended structure 425 in the first direction is greater than a width of the reflector 430. FIG. 12 is a top view of the suspended structure in this embodiment. As can be learned from the figure, the position 1-1 is the narrowest part of the suspended structure 425 in the first direction, and the width thereof is greater than the width of the reflector 430. A width difference is less than a horizontal distance between the reflector 430 and an edge of the chip.

In this embodiment, a width of a material that needs to be etched by an etchant is larger, and within a same time, a length and a depth by which the material is etched by an etchant are determinate. Therefore, a longer etching time is required. Therefore, the width difference can be adjusted to adjust the etching time, to avoid that the chip collapses because the support structure 442 is excessively etched or even is completely etched due to an excessively high etching speed, and reduce a difficulty in a manufacturing process.

Figure 13:
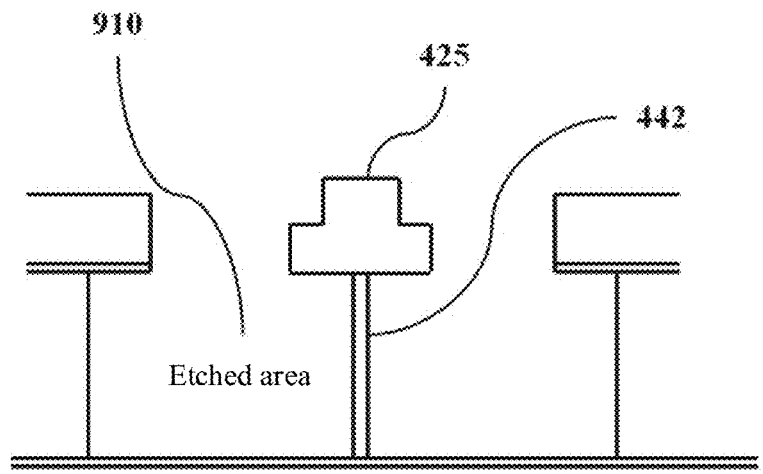
FIG. 13 is a sectional view of a part of a relatively small width of a suspended structure according to another embodiment of the present invention.
Figure 14:
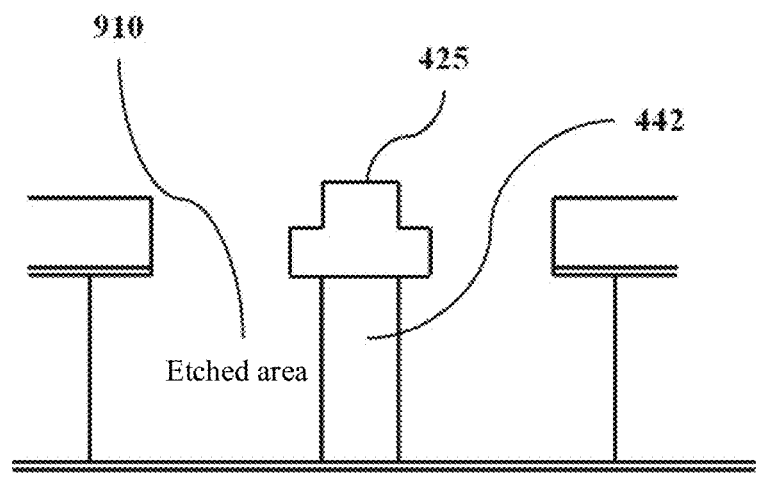
FIG. 14 is a sectional view of a part of a relatively large width of a suspended structure according to another embodiment of the present invention.

Optionally, in another embodiment, the suspended structure 425 is basically the same as that in the foregoing embodiments, and a difference lies in that: A material of the support layer 440 below the relatively narrow part of the suspended structure 425 in the first direction is not completely etched and hollowed out by means of a particular method, and a material of a small width remains. The support structure 442 is also formed in the vertical direction. Correspondingly, more materials of the support layer 440 below a relatively wide part of the suspended structure 425 in the first direction remain. The structure of the cross section of the relatively narrow part of the suspended structure 425 in the first direction is shown in FIG. 13, and the structure of the cross section of the relatively wide part is shown in FIG. 14. In this embodiment of the present invention, a support area is larger, there are more support structures, and higher mechanical strength can be provided.

Specifically, a time of an etching reaction between an etchant and the material of the support layer 440 may be shortened, or an amount of an etchant used to etch the material of the support layer 440 may be reduced, or another method may be used. This is not limited in this embodiment of the present invention.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A wavelength tunable laser, comprising:
    a substrate layer;
    a support layer disposed above the substrate layer and having a protection structure;
    a transport layer disposed above the support layer and comprising a lower cladding layer, a waveguide layer and an upper cladding layer, wherein the protection structure forms a hollow structure together with the transport layer and the substrate layer, and the hollow structure includes a support structure within a hollow area of the hollow structure between the lower cladding layer of the transport layer and the substrate layer, wherein gaps formed between the support structure and the protection structure are configured to insulate heat to increase heat acting on a reflector;
    a heating layer disposed above the transport layer; and
    the reflector disposed in the transport layer;
    wherein:
        in a first direction, there are gaps between a part, comprising the reflector, of the transport layer and materials on two sides of the transport layer, to form a suspended structure,
        within a length range of the reflector in the first direction, the gaps are configured to isolate the suspended structure from the materials on the two sides of the transport layer, so that the suspended structure is not connected to the materials on the two sides of the transport layer,
        the first direction is a transmission direction of light in the waveguide layer, and
        the suspended structure has a varying width in the first direction; and
    wherein the support structure comprises:
        a first support structure disposed below a wider part of the suspended structure;
        a second support structure disposed below a narrower part of the suspended structure; and
        wherein the first support structure is larger than the second support structure.

2. The laser according to claim 1, further comprising:
    in the first direction, a gap between the support structure and the protection structure.

3. The laser according to claim 1, further comprising:
    in a second direction, a gap between the support structure and the protection structure, wherein the second direction is perpendicular to the transmission direction of light in the waveguide layer.

4. The laser according to claim 1, wherein the reflector is located at a lower part of the upper cladding layer of the transport layer, at an upper part of the lower cladding layer, in both the upper cladding layer and the waveguide layer, or in both the lower cladding layer and the waveguide layer.

5. The laser according to claim 1, wherein the transport layer further comprises:
    a first barrier layer disposed below the lower cladding layer.

6. The laser according to claim 1, wherein the substrate layer further comprises:
    a substrate material layer; and
    a second barrier layer disposed above the substrate material layer.

7. The laser according to claim 1, wherein the transport layer further comprises:
    a dielectric layer disposed above the upper cladding layer.

8. The laser according to claim 1, wherein the suspended structure has a varying width in the first direction.

9. The laser according to claim 8, wherein the support structure is disposed below a wider part of the suspended structure, and the support structure is not disposed below a narrower part of the suspended structure.

10. The laser according to claim 8, wherein a width of the suspended structure in the first direction is greater than or equal to a width of the reflector in the first direction.

11. A wavelength tunable laser, comprising:
    a substrate layer;
    a support layer disposed above the substrate layer and having a protection structure;

a transport layer disposed above the support layer and comprising a lower cladding layer, a waveguide layer and an upper cladding layer, wherein the protection structure forms a hollow structure together with the transport layer and the substrate layer, and the hollow structure includes a support structure;

a heating layer disposed above the transport layer; and a reflector disposed in the transport layer;

wherein:
- in a first direction, there are gaps between a part, comprising the reflector, of the transport layer and materials on two sides of the transport layer, to form a suspended structure,
- within a length range of the reflector in the first direction, the gaps are configured to isolate the suspended structure from the materials on the two sides of the transport layer, so that the suspended structure is not connected to the materials on the two sides of the transport layer,
- the first direction is a transmission direction of light in the waveguide layer, and
- the suspended structure has a varying width in the first direction; and wherein the support structure comprises:
- a first support structure disposed below a wider part of the suspended structure;
- a second support structure disposed below a narrower part of the suspended structure; and
- wherein the first support structure is larger than the second support structure.

12. A method of manufacturing a wavelength tunable laser, the method comprising:

forming a substrate layer;

forming a support layer above the substrate layer;

removing a portion of the support layer to form a protection structure;

forming a transport layer above the support layer, the transport layer comprising an lower cladding layer, a waveguide layer and an upper cladding layer, wherein the protection structure forms a hollow structure together with the transport layer and the substrate layer, and the hollow structure comprises a support structure within a hollow area of the hollow structure between the lower cladding layer of the transport layer and the substrate layer, wherein gaps formed between the support structure and the protection structure are configured to insulate heat to increase heat acting on a reflector;

depositing a heating layer above the transport layer; and forming the reflector in the transport layer;

wherein:
- in a first direction, there are gaps formed between a part, comprising the reflector, of the transport layer and materials on two sides of the transport layer, to form a suspended structure,
- within a length range of the reflector in the first direction, the formed gaps are configured to isolate the suspended structure from the materials on the two sides of the transport layer, so that the suspended structure is not connected to the materials on the two sides of the transport layer,
- the first direction is a transmission direction of light in the waveguide layer, and
- the suspended structure has a varying width in the first direction; and wherein the support structure comprises:
- a first support structure formed below a wider part of the suspended structure;
- a second support structure formed below a narrower part of the suspended structure; and
- wherein the first support structure is larger than the second support structure.

13. The method according to claim 12, wherein the reflector is formed in the transport layer at a lower part of the upper cladding layer, at an upper part of the lower cladding layer, in both the upper cladding layer and the waveguide layer, or in both the lower cladding layer and the waveguide layer.

14. The method according to claim 12, wherein forming the transport layer further comprises:

forming a first barrier layer below the lower cladding layer of the transport layer.

15. The method according to claim 14, wherein before removing the portion of the support layer, the method further comprises:

removing portions of the transport layer in the first direction of the reflector and to expose the first barrier layer; and selectively removing portions of the first barrier layer to expose portions of the support layer so that a portion of the transport layer including the reflector, forms the suspended structure supported by a bottom support structure.

16. The method according to claim 12, wherein forming the substrate layer further comprises:

forming a substrate material layer; and forming a second barrier layer above the substrate material layer.

17. The method according to claim 12, wherein before depositing the heating layer above the transport layer, the method further comprises:

forming a dielectric layer above the upper cladding layer.

* * * * *